(12) United States Patent
Li

(10) Patent No.: US 6,599,767 B1
(45) Date of Patent: Jul. 29, 2003

(54) METHOD OF AVOIDING BONDING PAD OXIDATION IN MANUFACTURING AN OLED DEVICE

(75) Inventor: Chun-Huai Li, Ping Tung Hsien (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/223,212

(22) Filed: Aug. 20, 2002

(30) Foreign Application Priority Data

Jul. 19, 2002 (TW) ........................................ 91116189 A

(51) Int. Cl.$^7$ ................................................ H01L 21/00
(52) U.S. Cl. .......................... 438/22; 438/29; 438/151; 438/155; 438/608; 438/609; 438/612
(58) Field of Search .......................... 438/22, 29, 151, 438/155, 608, 609, 612

(56) References Cited

U.S. PATENT DOCUMENTS

| | | | |
|---|---|---|---|
| 5,721,160 A | * 2/1998 | Forrest et al. ................. | 438/22 |
| 6,322,712 B1 | * 11/2001 | Hanson et al. ............... | 438/608 |
| 6,387,600 B1 | * 5/2002 | Hanson ....................... | 430/316 |
| 6,471,879 B2 | * 10/2002 | Hanson et al. ............... | 438/608 |
| 2002/0011459 A1 | * 1/2002 | Hanson et al. ................. | 216/4 |
| 2002/0086244 A1 | * 7/2002 | Hanson ....................... | 430/319 |

* cited by examiner

Primary Examiner—John F. Niebling
Assistant Examiner—Lynne A. Gurley
(74) Attorney, Agent, or Firm—Troxell Law Office PLLC

(57) ABSTRACT

A method is disclosed for avoiding oxidation of a bonding pad served as an electrical connection to devices mounted on a transparent insulating substrate of a thin-film transistor applied to an organic light emitting diode (OLED). Firstly, the bonding pads are defined on the transparent insulating substrate. Then, an ITO defending layer and an indium tin oxide (ITO) anode are defined simultaneously on the bonding pads and partial of the transparent insulating substrate surface, respectively. The ITO defending layer described above is provided to prevent the bonding pad from being oxidized. The oxidation upon the bonding pad is reduced, so that the conductivity thereof can be ensured.

11 Claims, 3 Drawing Sheets

10
| | |
|---|---|
| Metal cathode | ~24 |
| Electron transporting layer | ~22 |
| Emitting layer | ~20 |
| Hole transporting layer | ~18 |
| Hole injecting layer | ~16 |
| Transparent anode | ~14 |
| Transparent insulating substrate | ~12 |
FIG. 1 (Prior Art)
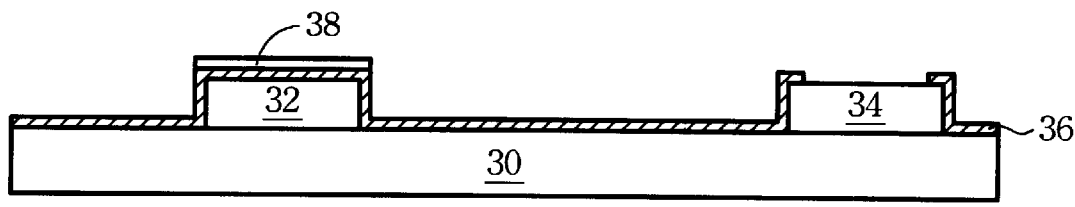
FIG. 2 (Prior Art)
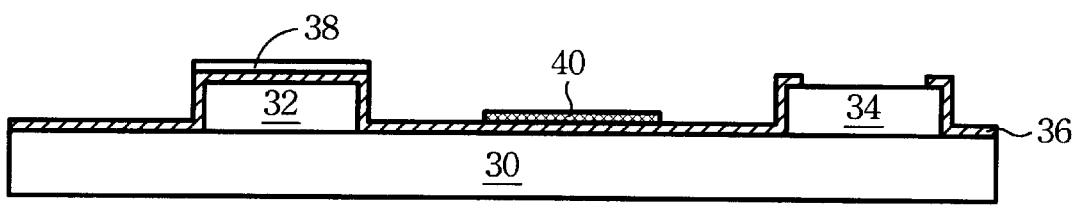
FIG. 3 (Prior Art)

METHOD OF AVOIDING BONDING PAD OXIDATION IN MANUFACTURING AN OLED DEVICE

FIELD OF THE INVENTION

The present invention relates to a method of manufacturing an organic light emitting diode (OLED) display and, more particularly, to a method of simultaneously defining an indium tin oxide (ITO) defending layer and an ITO pixel electrode on the bonding pad and partial of the transparent insulating substrate surface, respectively.

BACKGROUND OF THE INVENTION

Owing to high brightness, fast response speed, light, thin and small features, full color, no viewing angle differences, no need for an LCD back-light board and low electrical consumption, an organic light emitting diode (OLED) display takes the lead to substitute a twist nematic (TN) or a super twist nematic (STN) liquid crystal display. Further, it substitutes for a small-sized thin-film transistor (TFT) LCD to become a new display material of fabricating portable information products, cell phones, personal digital assistants (PDAs) and notebooks.

Please refer to FIG. 1. An OLED 10 is comprised of several layers in which at least one of the several layers comprises an organic material that can be made to electroluminesce by applying a voltage across the device. As shown in the figure, there are four organic layers sandwiched between a transparent anode 14 and a metal cathode 24. These organic layers comprise a hole injecting layer 16, a hole transporting layer 18, an emitting layer 20 and an electron transporting layer 22. Generally, the material of the transparent anode 14, fabricated on the transparent insulating substrate 12 by methods of sputtering or vacuum evaporation, is selected from an ITO or similar oxide compounds. In addition, the metal cathode 24 is made of a magnesium, an aluminum, or a lithium. When the applied voltage between the transparent anode 14 and the metal cathode 24 is high enough, charge carriers such as electrons and holes are injected into organic layers. An electron-hole pair can be formed thereafter to recombine radiatively and emit light if the electrons and holes meet.

The ITO layer mentioned above is a conductive oxide film with high transparency, and mainly comprised of an indium oxide (about 90~95%) and a tin oxide (about 5~10%). Up to today, this conductive metal oxide is generally applied to the manufactures of an LCD, a touch panel and an OLED.

In OLED manufacture, the forming process of the ITO is variable according to the method of light emitting, such as top emitting or bottom emitting.

FIG. 2 and FIG. 3 disclose a TFT fabrication of an OLED. Firstly, metal patterns are defined simultaneously on a transparent insulating substrate 30, wherein the metal patterns include a gate structure 32 and a bonding pad 34. Then, a gate dielectrics 36 is formed on the transparent insulating substrate 30 and covers both the gate structure 32 and the bonding pad 34. After that, partial portion of the gate dielectrics located above the bonding pad 34 is removed to expose the pad's 34 upper surface, providing an electrical connection to devices mounted on the transparent insulating substrate 30. Next, a silicon-based layer 38 is formed on the partial gate dielectrics 36 over the gate structure 32. An ITO pixel electrode 40 is defined on the further partial of the gate dielectrics 36 uncovered by the silicon-based layer 38.

It's worthy to note that, after the formation of ITO pixel electrode 40 and before the generation of an organic layer, an oxygen plasma pre-treatment is performed to remove residues remained on the ITO pixel electrode 40 surface during the process so as to improve quality of the ITO. This treatment, however, leads to oxidation of the exposed bonding pad 34 and formation of a metal oxide layer thereon. Based on these, the conductivity of the bonding pad 34 and the yield of the process will be lowered.

SUMMARY OF THE INVENTION

It is therefore the first objective of the present invention to provide a method of manufacturing a bonding pad which is served as an electrical connection to devices fabricated on a transparent insulating substrate.

The second objective of the present invention is to provide a method of forming an ITO defending layer and an ITO pixel electrode simultaneously on the bonding pad and partial upper surface of the transparent insulating substrate, respectively.

The third objective of the present invention is to provide a method of manufacturing an ITO defending layer, without adding or altering any present process step, for avoiding oxidation of the bonding pad.

To accomplish these above objectives, according to the present invention, firstly metal patterns include a gate structure and a bonding pad are defined simultaneously on a transparent insulating substrate, wherein the bonding pad is used to provide an electrical connection to devices fabricated on the transparent insulating substrate. A gate dielectrics and a silicon-based layer are then deposited sequentially on the gate structure. After that, the silicon-based layer, except the portion above the gate structure, is removed by an etching process. An ITO defending layer and an ITO pixel electrode are defined simultaneously on the bonding pad and the partial gate dielectrics uncovered by the silicon-based layer, respectively. The ITO defending layer described above is served to protect the bonding pad from being oxidized and to ensure the conductivity thereof. Next, a metal layer is formed on the transparent insulating substrate for covering the silicon-based layer. The metal layer is lastly patterned to define drain and source electrodes over the gate structure and to expose the upper surface of the silicon-based layer, in which the source electrode is further connected with the ITO pixel electrode.

In this embodiment, the drain and source electrodes are formed of an aluminum and a chromium. The gate dielectrics is formed of an SiNx, an $SiO_2$ or a high-k layer. The silicon-based layer is chosen from an amorphous silicon.

Additional objective, advantages and novel features of the invention will be set forth in part in the description which follows, and in part will become apparent those who skilled in the art upon examination of the following or may be learned by practice of the invention. The objectives and advantages of the invention may be realized and attained by means of the instrumentalities and combinations particularly pointed out in the appended claims.

BRIEF DESCRIPTION OF THE DRAWINGS

The foregoing aspects and many of the attendant advantages of this invention will become more readily appreciated and understood by referencing the following detailed description in conjunction with the accompanying drawings, wherein:

FIG. 1 is a cross-sectional view of an OLED, illustrating general compositions thereof;

FIG. 2 is a cross-sectional view of a TFT applied to an OLED for describing a method of defining a TFT and a bonding pad on a transparent insulating substrate according to the prior art;

FIG. 3 is a cross-sectional view of a TFT applied to an OLED for describing a method of forming an ITO pixel electrode on the partial surface of a gate dielectrics uncovered by a silicon-based layer in accordance with the prior art;

DETAILED DESCRIPTION OF THE PREFERRED EMBODIMENT

In order to solve the problems taken from the background described previously, a method is disclosed hereinafter to provide a method of fabricating a bonding pad on a transparent insulating substrate. More particularly, this invention provides a method of forming an ITO defending layer and an ITO pixel electrode simultaneously on the bonding pad and partial of the transparent insulating substrate surface, in which the ITO defending layer is used to prevent the bonding pad from being oxidized. The method will be described in more detail with reference to accompanying drawings.

Figure 4:
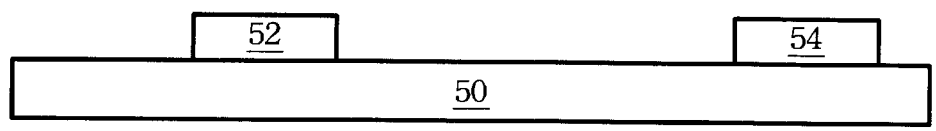
FIG. 4 is a cross-sectional view of a TFT applied to an OLED for describing a method of forming a gate structure and a bonding pad simultaneously on a transparent insulating substrate according to the present invention.
Figure 5:
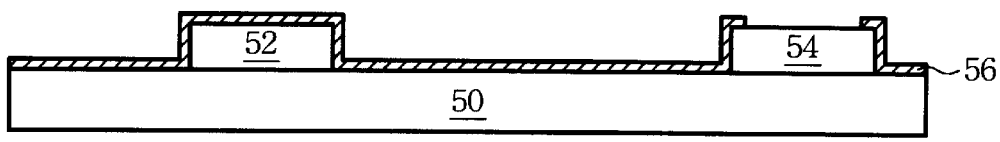
FIG. 5 is a cross-sectional view of a TFT applied to an OLED for describing a method of forming a gate dielectrics on the transparent insulating substrate according to the present invention.

Please refer to FIG. 4, wherein a first metal layer is deposited on a transparent insulating substrate 50, such as a glass or a plastic. In this invention, the first metal layer is formed of a chromium layer or any the like. The first metal layer is etched to define metal patterns on the transparent insulating substrate 50. The metal patterns include a gate structure 52 and a bonding pad 54. Please refer to FIG. 5. A gate dielectrics 56 is fabricated on the transparent insulating substrate 50 for covering the gate structure 52 and the bonding pad 54. In one preferred embodiment, the gate dielectrics 56 is formed of an SiNx, an SiO₂ or a high-k layer. Thereafter, an etching process is performed to remove the partial portion of the gate dielectrics 56 positioned on the bonding pad 54 for exposing its upper surface. The exposed bonding pad 54 provides an electrical connection to devices mounted on the transparent insulating substrate 50. Namely, devices of the OLED execute their functions by applying a voltage and a signal to the bonding pad 54.

Figure 6:
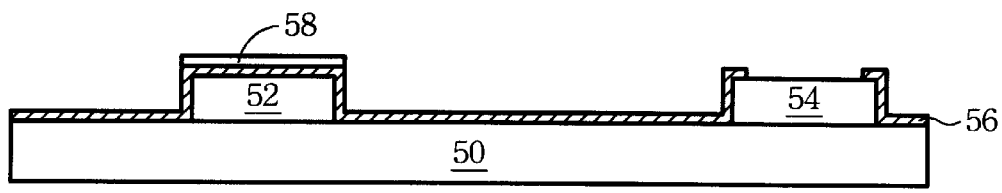
FIG. 6 is a cross-sectional view of a TFT applied to an OLED for describing a method of forming a silicon-based layer on the partial gate dielectrics over the gate structure in accordance with the present invention.

Please refer to FIG. 6. A silicon-based layer 58, such as an amorphous silicon or a polysilicon, is deposited on the gate dielectrics 56. An etching process is then performed to remove the silicon-based layer 58 except the portion over the gate structure 52.

Figure 7:
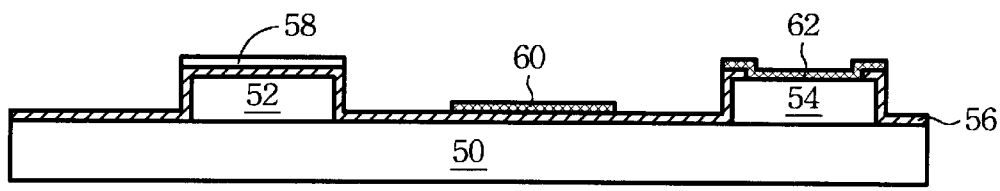
FIG. 7 is a cross-sectional view of a TFT applied to an OLED for describing a method of forming an ITO defending layer and an ITO pixel electrode according to the present invention.

Referring to FIG. 7, an ITO layer is deposited on the structure of FIG. 6. After that, a photoresist layer (not shown herein) is fabricated on the ITO layer and patterned by using a photo mask. The ITO layer is etched using the photoresist layer pattern as an etching mask to define an ITO defending layer 62 and an ITO pixel electrode 60 on the bonding pad 54 and partial of the gate dielectrics 56, respectively. Next, an oxygen plasma pre-treatment is performed to remove residues remained on the ITO pixel electrode 60 surface during the process so as to improve quality of the ITO. In addition, the ITO defending layer 62 is made to prevent upper of the bonding pad 54 surface from being oxidized and to ensure conductivity of the bonding pad 54.

It's only required to vary the pattern of the photo mask instead of adding any new process step while defining the ITO pixel electrode 60 and the ITO defending layer 62 simultaneously.

Figure 8:
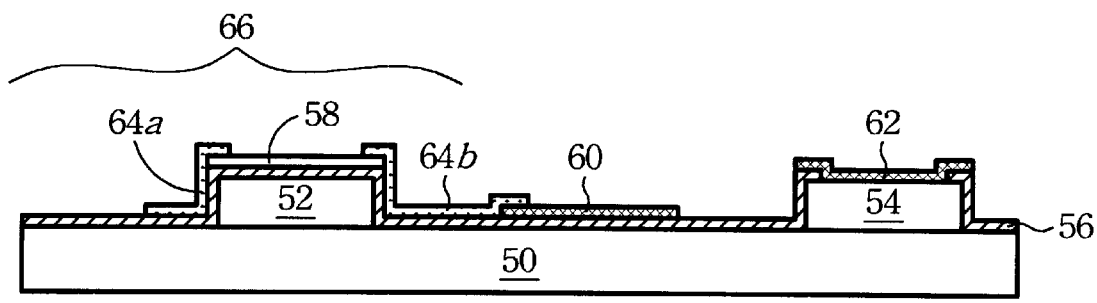
FIG. 8 is a cross-sectional view of a TFT applied to an OLED for describing a method of forming drain and source electrodes according to the present invention.
Figure 9:
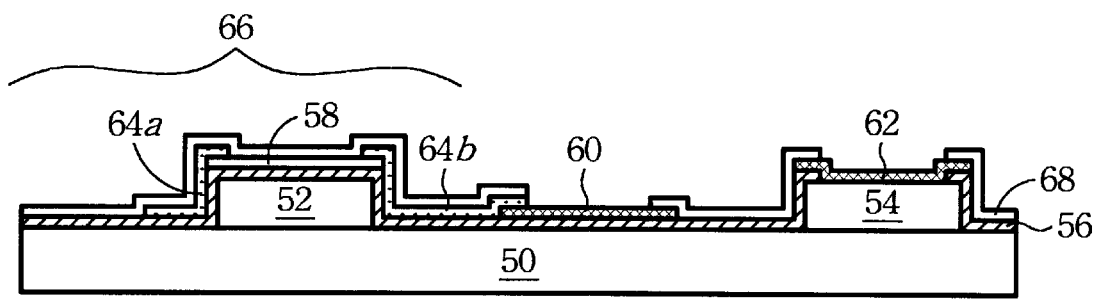
FIG. 9 is a cross-sectional view of a TFT applied to an OLED for describing a method of forming a passivation layer according to the present invention.

Please refer to FIG. 8, wherein a second metal layer is deposited on the structure of FIG. 7. The second metal layer is etched to define a drain 64a and a source 64b for forming a TFT 66 on the transparent insulating substrate 50. The source 64b is connected with the ITO pixel electrode 60. After that, a passivation layer 68 is deposited on the structure of FIG. 8, as shown in FIG. 9. In this invention, the passivation layer 68 can be made of an SiNx, an SiO₂, or a low-k material. Next, the passivation layer 68 is etched to expose upper of the ITO pixel electrode 60 surface and the ITO defending layer 62.

Figure 10:
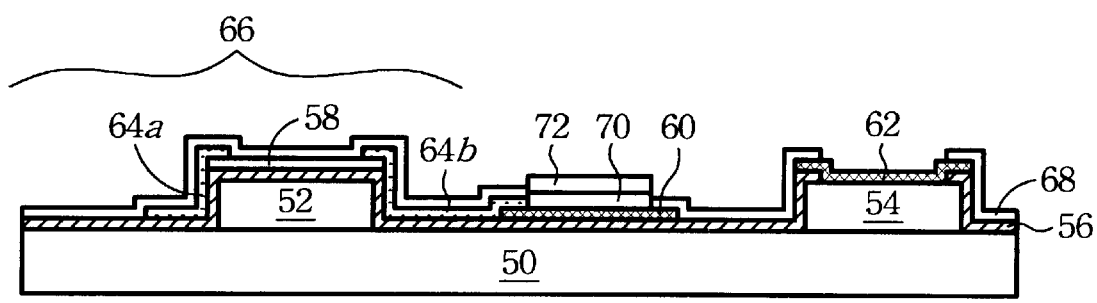
FIG. 10 is a cross-sectional view of a TFT applied to an OLED for describing a method of sequentially forming an OLED layer and a metal cathode on the ITO pixel electrode according to the present invention.

Please refer to FIG. 10. An organic layer 70 and a metal cathode 72 are formed subsequently on the ITO pixel electrode 60, wherein the metal cathode 72 is made of a magnesium, an aluminum, a lithium or any other similar material.

Because the ITO layer is already an existing material in the process, there is no need to alter or add any other material therein.

In addition, since forming the ITO layer on the structure of FIG. 7 is an original step of the process, it's not necessary to alter the process steps either.

Further, if the oxidation of the bonding pad is avoided, process yield can then be improved dramatically.

Although the preferred embodiment of this invention has been disclosed for illustrative purpose, those skilled in the art will appreciate that various modification, additions and substitutions are possible, without departing from the scope and spirit of the invention as described in the accompanying claims.

What is claimed is:

1. A method of avoiding bonding pad oxidation in manufacturing an OLED device, comprising steps of:

defining the bonding pad of the OLED device on a transparent insulating substrate for providing an electrical connection to devices fabricated on the transparent insulating substrate; and forming an ITO defending layer and an ITO pixel electrode simultaneously on the bonding pad and partial of the transparent insulating substrate respectively, wherein the ITO defending layer is used to prevent the bonding pad from being oxidized and to ensure the conductivity thereof.

2. The method according to claim 1, wherein the transparent insulating substrate is chosen from a glass.

3. The method according to claim 1, wherein the transparent insulating substrate is chosen from a plastic.

4. A method of avoiding bonding pad oxidation in manufacturing an OLED device, comprising steps of:

- defining a gate structure and the bonding pad of the OLED device on a transparent insulating substrate simultaneously, wherein the bonding pad is served to provide an electrical connection to devices fabricated on the transparent insulating substrate;
- forming a gate dielectric and a silicon-based layer sequentially on the gate structure;
- removing the silicon-based layer except the portion over the gate structure;
- simultaneously defining an ITO defending layer and an ITO pixel electrode on the bonding pad and the partial of the gate dielectric respectively, wherein the ITO defending layer is used to prevent the bonding pad from being oxidized and to ensure the conductivity thereof; and
- defining a drain and a source above the gate dielectric to form a transistor on the transparent insulating substrate, wherein the source is connected with the ITO pixel electrode.

5. The method according to claim 4, wherein the transparent insulating substrate is chosen from a glass.

6. The method according to claim 4, wherein the transparent insulating substrate is chosen from a plastic.

7. The method according to claim 4, wherein the gate dielectric is made of an SiNx layer.

8. The method according to claim 4, wherein the gate dielectric is made of an $SiO_2$ layer.

9. The method according to claim 4, wherein the gate dielectric is made of a high-k layer.

10. The method according to claim 4, wherein the silicon-based layer is chosen from an amorphous silicon.

11. The method according to claim 4, wherein the silicon-based layer is chosen from a polysilicon.

* * * * *